United States Patent [19]

Inoue

[11] Patent Number: 4,532,451
[45] Date of Patent: Jul. 30, 1985

[54] TERMINALS AND MOUNTING FOR PIEZOELECTRIC RESONATORS

[75] Inventor: Jiro Inoue, Kanazawa, Japan

[73] Assignee: Murata Manufacturing Co., Ltd., Japan

[21] Appl. No.: 565,043

[22] Filed: Dec. 23, 1983

[30] Foreign Application Priority Data

| Dec. 28, 1982 | [JP] | Japan | 57-230907 |
| Dec. 28, 1982 | [JP] | Japan | 57-230908 |
| Dec. 28, 1982 | [JP] | Japan | 57-202135[U] |
| Dec. 28, 1982 | [JP] | Japan | 57-202136[U] |
| Dec. 29, 1982 | [JP] | Japan | 57-234363 |

[51] Int. Cl.³ .......................................... H01L 41/08
[52] U.S. Cl. ................... 310/353; 310/348; 310/354; 310/366
[58] Field of Search ............ 310/363, 364, 345, 348, 310/351–356, 320, 366

[56] References Cited

U.S. PATENT DOCUMENTS

| 3,970,880 | 7/1976 | Deutschmann et al. | 310/353 X |
| 4,112,324 | 9/1978 | Yamaguchi et al. | 310/353 |
| 4,267,480 | 5/1981 | Kanematsu et al. | 310/354 X |
| 4,292,562 | 9/1981 | Feder | 310/320 X |
| 4,322,652 | 3/1982 | Otsuka | 310/354 X |
| 4,360,754 | 11/1982 | Toyoshima et al. | 310/354 X |
| 4,431,938 | 2/1984 | Inoue | 310/355 X |

FOREIGN PATENT DOCUMENTS 0000635 1/1980 Japan ............................... 310/348

Primary Examiner—Mark O. Budd
Attorney, Agent, or Firm—Ostrolenk, Faber, Gerb & Soffen

[57] ABSTRACT

A piezoelectric resonator (100) includes a piezoelectric resonating element (4), a lead frame (7), a base (8) and a common electrode plate (9). The lead frame includes common terminals (77, 722 and 791) connectable with two input and output electrodes (42 and 43) of the piezoelectric resonating element, first terminals (73, 731 and 76) electrically connectable with one of the two electrodes or the input electrode (42) of the piezoelectric resonating element, second terminals (75, 751, 78 and 723) electrically connectable with the other of the two electrodes or the output electrode (43) of the piezoelectric resonating element, and a connection member (79) for electrical connection of the common terminals with either one of the first and second terminals. When the connection member is disconnected from the first and second terminals, it becomes possible to structure a piezoelectric resonator with a plurality of piezoelectric resonating elements. Furthermore, when the connection member is detached from either of the first and second terminals, it becomes possible to structure a piezoelectric resonator with a single piezoelectric resonating element.

16 Claims, 28 Drawing Figures

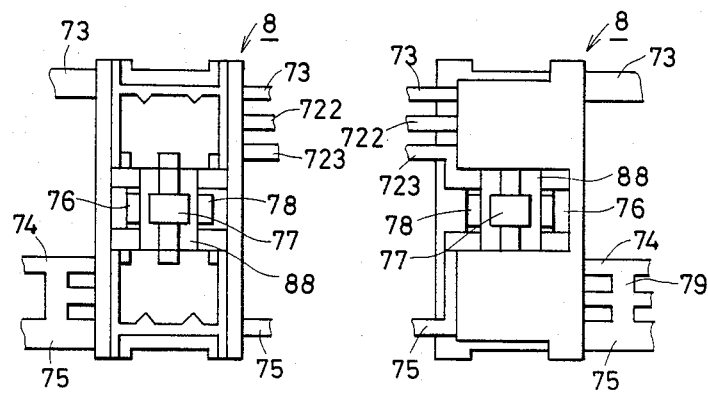
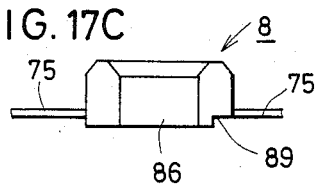
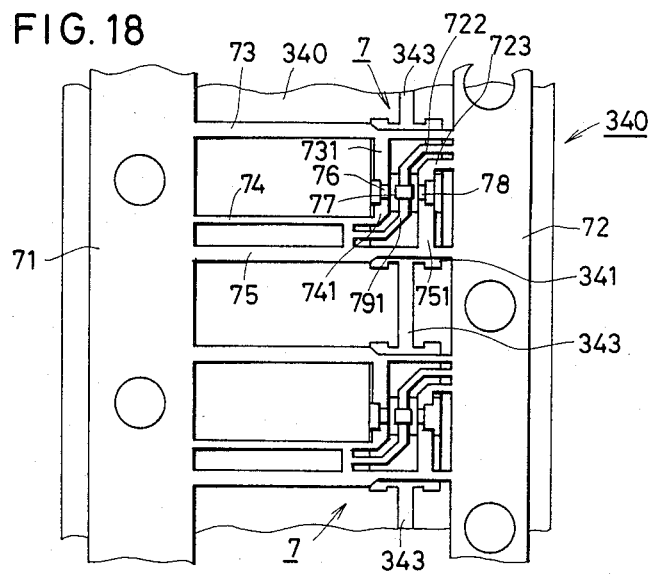

TERMINALS AND MOUNTING FOR PIEZOELECTRIC RESONATORS

BACKGROUND OF THE INVENTION

1. Field of the Invention

The present invention relates to a piezoelectric resonator. More particularly; the present invention relates to an improved terminal structure for electrical connection with input and output electrodes of a three-terminal type piezoelectric resonating element.

2. Description of the Prior Art

FIG. 1 illustrates an exploded perspective view of a conventional piezoelectric resonator which is the background art for the present invention; FIG. 2 illustrates a perspective view of the appearance of a piezoelectric resonating element 4 included in the device of FIG. 1; and FIG. 3 illustrates an electric equivalent of the piezoelectric resonating element 4 as shown in FIG. 2.

Referring first to FIGS. 1 to 3, the conventional piezoelectric resonator as the background art for the present invention will be discussed. A lead frame 1 includes a tape-shaped hoop 11, "L" shaped lead portions 12 and 13 extending from the hoop and contact portions 14 and 15 at the pointed portions of the respective lead portions 12 and 13. The contact portions 14 and 15 of the lead frame 1 are housed in a base 2. The base 2 is provided with a cavity 21 for accommodation of the contact portions 14 and 15 of the lead frame 1 and terminal lead-out portions 22 and 23 for leading the lead portions 12 and 13 of the lead frame 1 out of the base 2. There is further provided at a side wall of the base 2 a withdrawing portion 24 for withdrawing a lead portion 52 of a common electrode plate 5, described below, out of the base 2. It is noted that the contact portions 14 and 15 of the lead frame 1 are accommodated within the cavity 21 in the base 2, with the lead portions 12 and 13 being withdrawn through the terminal withdrawing portions 22 and 23. There is mounted a sheet 3 of anisotropic conductive rubber on the contact portions 14 and 15. The anisotropic conductive rubber sheet 3 exhibits conductivity in a vertical direction but no conductivity in a horizontal one because of very fine stainless wires embedded in the rubber sheet in the vertical direction, for example.

Disposed over the above mentioned anisotropic conductive rubber sheet 3 is a piezoelectric resonating element 4. The piezoelectric resonating element 4, as indicated in FIG. 2, bears an input electrode 42 and an output electrode 43 on one major surface of a piezoelectric unit 41 and a whole electrode 44 on the opposite major surface thereof. A groove 45 is defined between the input electrode 42 and the output electrode 43, while grooves 46 and 47 are defined in the input electrode 42 and the output electrode 43 to prevent spurious oscillation. As seen from FIG. 3, the piezoelectric resonating element 4 behaves as a three-terminal type piezoelectric resonating element and causes longitudinal oscillation at a fundamental frequency as determined by the longitudinal length of the element. The piezoelectric resonating element 4 is mounted on the above mentioned anisotropic conductive rubber sheet 3 with the input electrode 42 and the output electrode 43 oriented downwardly. Since under these circumstances the anisotropic conductive rubber sheet 3 exhibits conductivity in the vertical direction, the input electrode 42 and the output electrode 43 of the piezoelectric resonating element 4 come into electrical contact with the contact portions 14 and 15 by way of the anisotropic conductive rubber sheet 3.

Furthermore, there is disposed the common electrode plate 5 which is in contact with the whole electrode 44 on the piezoelectric resonating element 4. The common electrode plate 5 includes a lead portion 52 extending from a hoop 51. The lead portion 52 has an "L" shaped bend portion 53 to be fitted into the terminal withdrawing portion 24 in the base 2, which bend portion 53 bears at its pointed portion a contact portion 54 so bent as to come into contact with the whole electrode 44 on the piezoelectric resonating element 4. The contact portion 54 has at its both ends press portions 55 and 56 which abut against an inner wall of a casing 6 discussed below and urge the contact portion 54 against the whole electrode 44 on the piezoelectric resonating element 4. The common electrode plate 5 is housed in the base 2 so that the contact portion 54 thereof may come to electric contact with the whole electrode 44 of the piezoelectric resonating element 4 substantially at a central node point. The unit with its components in the base 2 is inserted into the casing 6 having an opening 61 at its one side. Eventually, synthetic resin is injected through the opening 61 of the casing 6 to integrate the base 2 and the casing 6 into a single unit.

FIG. 4 is a perspective view of the piezoelectric resonator so assembled as best shown in FIG. 1.

In some instances two of the piezoelectric resonators 20 assembled as in FIG. 1 are serially connected as shown in an equivalent circuit diagram of FIG. 5, for example. In this instance it is more convenient for subsequent manipulation and assembling of the device if the two piezoelectric resonators 20 are combined into an integral unit prior to the assembling of the device. To this end, the two piezoelectric resonators 20 are adhered together, with the casing 6 of one of the resonators in close contact with the casing 6 of the other, in a conventional device of FIG. 6. In an alternative conventional device of FIG. 7, a cabinet 30 is prepared for accommodation and integration of the two piezoelectric resonators 20. The conventional devices of FIGS. 6 and 7 require the assembling of the two piezoelectric resonators 20 for integration after the makeup of the individual piezoelectric resonators 20. In the device of FIG. 7, the cabinet 30 is additionally required with attendant increase in the manufacturing cost. Another outstanding disadvantage is that the device consisting of mere adhesion of the two piezoelectric resonators 20 becomes larger in size and the device using the cabinet 30 becomes much larger by the size of the cabinet 30.

SUMMARY OF THE INVENTION

Accordingly, it is the primary object of the present invention to provide a piezoelectric resonator which is capable of connecting one piezoelectric resonating element or a plurality of piezoelectric resonating elements in multi-stage fashion in a single casing, which can reduce the cost, and which leads itself well to compact implementation when a plurality of piezoelectric resonating elements are used.

It is another object of the present invention to provide a method for making a terminal-integrated casing which includes as an integral unit casing for receiving a piezoelectric resonating element and terminals and has no risk of contact portions thereof to be in contact with the piezoelectric resonating element being deformed during the manufacturing of the casing.

It is still another object of the present invention to provide a method for cutting terminals in a terminal-integrated casing which is free of risk of the casing being partially damaged when cutting unnecessary portions of terminals formed as extending from a hoop.

Briefly stated, the present invention provides a piezoelectric resonator comprising a common terminal electrically connectable with each input electrode and each output adjacent thereto in a plurality of piezoelectric resonating elements, a first terminal electrically connectable with the input electrode of one of the plurality of piezoelectric resonating elements, a second terminal electrically connectable with the output electrode of other piezoelectric resonating element adjacent to the above described element and a connection member for making possible an electrical connection of the common terminal to either one of the first and second terminals, wherein it is possible to structure a piezoelectric resonator with a plurality of piezoelectric resonating elements upon detaching the connection member from the first and second terminals and, wherein it is possible to structure a piezoelectric resonator with a single piezoelectric resonating element upon detaching the connection member from either of the first and second terminals.

As a result, the present invention makes it possible to utilize ( at the option of the user of the device) either a plurality of piezoelectric resonating elements in the piezoelectric resonator with multi-stage connection terminals or a single piezoelectric resonating element. Therefore, when a plurality of resonating elements are used, there is no need for sophisticated assembling steps for integration of individual piezoelectric resonators after the makeup of those individual resonators, as done in the prior art technique. The piezoelectric resonator in which the plurality of the piezoelectric resonating elements are connected in multi-stage fashion in the casing is further advantageous: compactness of the whole structure, facility of automatic assembling and cost savings due to the fact that components and process are commonly used with the case where a single piezoelectric element is used.

In a preferred embodiment of the present invention, the common terminal and the first and second terminals are provided in integral form with the casing for accommodation of the piezoelectric resonating elements. The casing is provided with a receiving portion into which a pawl member formed in a common electrode plate in contact with the common electrodes of the piezoelectric resonating elements is fitted. The piezoelectric resonating elements are mechanically supported by the common electrode plate together with the casing while the pawl member is fitted into the receiving portion of the casing with two contact arms of the common electrode plate in electrical contact with whole electrodes of two of the piezoelectric resonating elements.

In the preferred embodiment of the present invention, there is no possible misalignment of the contact arms of the common electrode plate from node points of the piezoelectric resonating elements. Not only the drawback of the prior art device is eliminated that careful attention should be paid not to misalign the contact arms of the common electrode plate with respect to the node points of the piezoelectric resonating elements, but also accuracy of assembling is enhanced and automatic assembling is simplified. In addition, insertion loss is minimized and frequency characteristics are improved.

In a second invention, there is provided a method for making a terminal-integrated casing which includes as an integral unit a common terminal, first and second terminals and a casing for accommodation of a piezoelectric resonating element, said method comprising the steps of: placing a first mold from one side of the terminals for abutment against a flat portion in proximity of contact portions; placing a second mold from the other side of the terminals for abutment against the flat portion except for the contact portions; defining a first cavity in proximity of the contact portions and a second cavity in the flat portion; and injecting insulating resin into the second cavity.

Therefore, the second invention makes it possible to manufacture the terminal-integrated casing without attachment of the insulating resin on the contact portions. When electrodes of the piezoelectric resonating element are forced into contact with the contact portions of the terminal-integrated casing so completed, good electric contact is guaranteed and automatic assembling procedures are simplified.

According to a third invention, there is provided a method for cutting unnecessary portions of terminals in a terminal-integrated casing, said method comprising the steps of: forming a step portion in the casing so as to expose at least a portion of terminals placing a mold from one side for abutment against the exposed portion of the terminals at the step portion of the casing; and cutting the unnecessary portions of the terminals upon applying shearing force from the other side along one edge surface of the casing. Therefore, the corner portions of the casing are never chipped because the shearing force exerted on the corner portions is distributed through the mold placed against the step portion.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 17A, 17B and 17C are external views of a terminal-integrated casing manufactured according to the present invention, wherein FIG. 17A is a plan view; FIG. 17B is a bottom view and FIG. 17C is a side view;

FIG. 18 is a view for explaining a method for making a terminal-integrated casing, especially a plan view showing the lead frame mounted on a lower mold;

FIGS. 21A and 21B are views showing a terminal-integrated casing manufactured by a method as depicted in FIGS. 18 through 20, wherein FIG. 21A is a cross-sectional front view and FIG. 21B is a cross-sectional side view;

DESCRIPTION OF THE PREFERRED EMBODIMENTS

Figure 1:
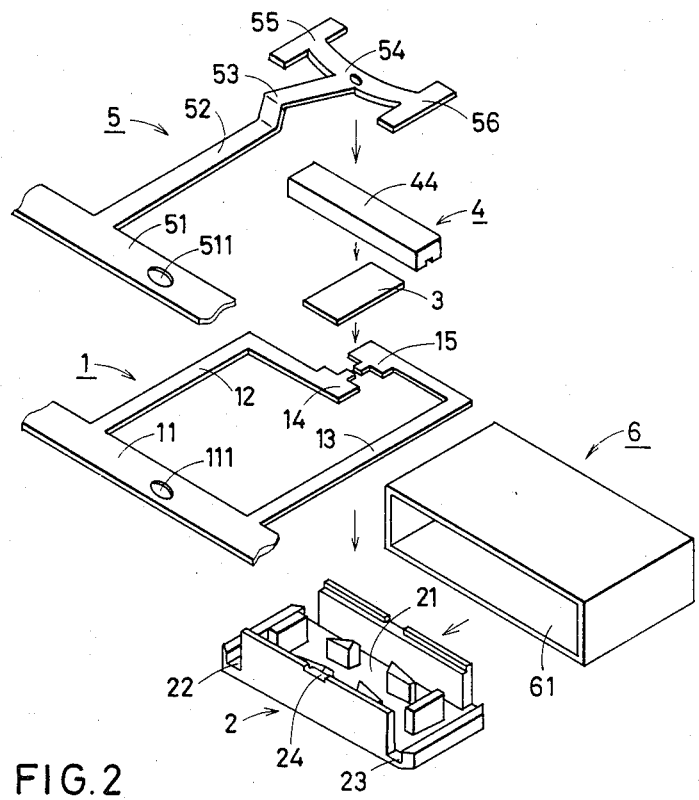
FIG. 1 is an exploded perspective view of a conventional piezoelectric resonator which is the background art for the present invention.
Figure 2:
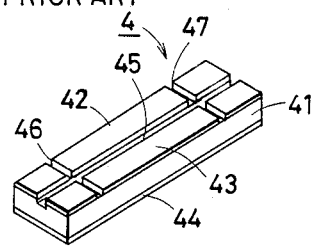
FIG. 2 is a perspective view of the appearance of a piezoelectric resonating element as included in the piezoelectric resonator of FIG. 1.
Figure 3:
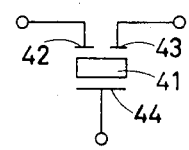
FIG. 3 is an electrical representation of the piezoelectric resonator as shown in FIG. 2.
Figure 4:
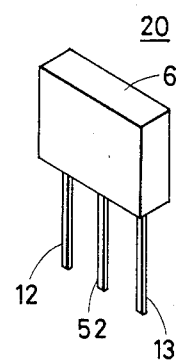
FIG. 4 is a perspective view of the appearance of the piezoelectric resonator assembled as in FIG. 1.
Figure 5:
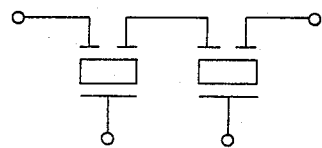
FIG. 5 is an equivalent circuit diagram showing a series combination of two piezoelectric resonators.
Figure 6:
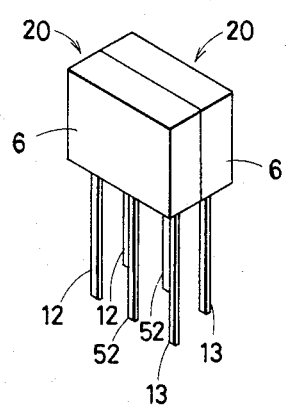
FIGS. 6 and 7 are views showing the two piezoelectric resonators assemblied in integral form.
Figure 7:
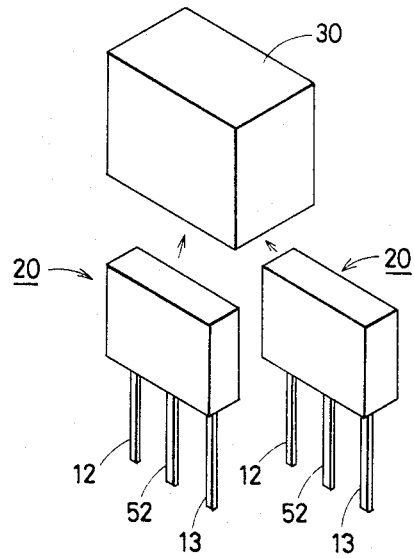
Figure 8:
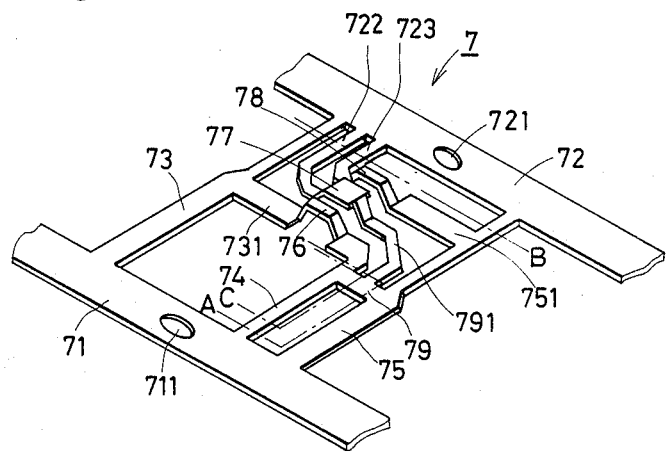
FIG. 8 is a perspective view illustrating the appearance of a lead frame as included in an embodiment of the present invention.
Figure 9:
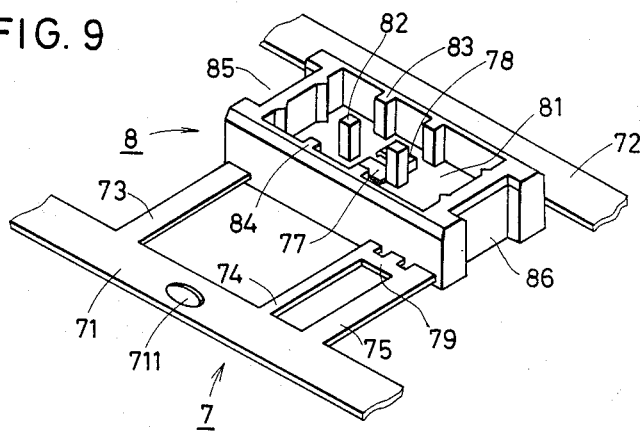
FIG. 9 is a perspective view of the appearance of the lead frame of FIG. 8 with a base molded therein.
Figure 10:
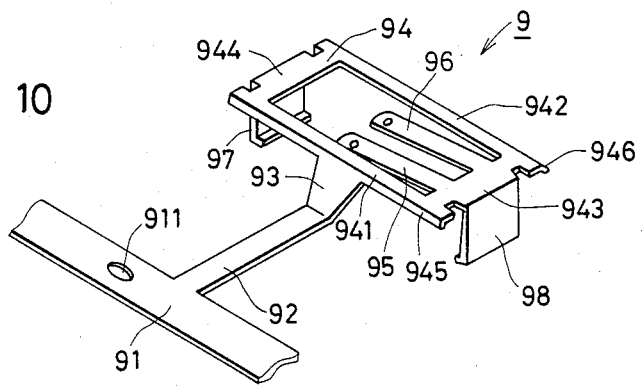
FIG. 10 is a perspective view of the appearance of a common electrode plate as included in the embodiment of the present invention.
Figure 11:
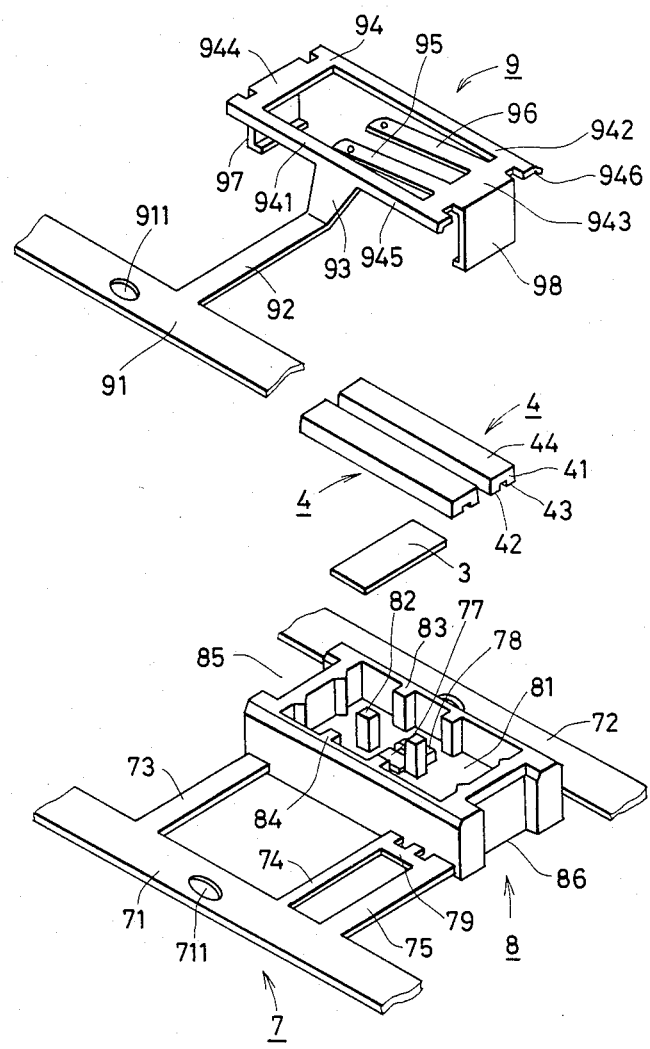
FIG. 11 is an exploded perspective view of the embodiment of the present invention.
Figure 12:
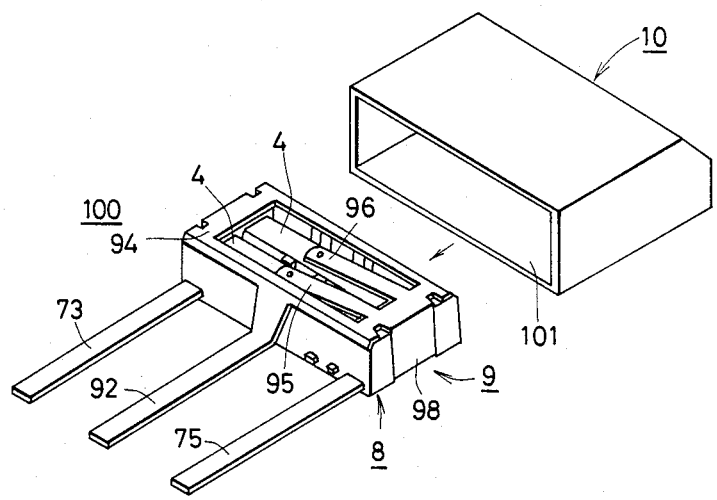
FIG. 12 is a perspective view showing the appearance of a unit and a casing as included in the embodiment of the present invention.

FIG. 8 is a perspective view depicting the appearance of a lead frame 7 as included in an embodiment of the present invention; FIG. 9 is also a perspective view depicting the lead frame 7 with a base 8 molded therein; FIG. 10 is also an external perspective view of a common electrode plate 9; FIG. 11 is an exploded perspective view of a piezoelectric resonator; and FIG. 12 is an external perspective view of an assembly unit 100 and a casing 10.

Referring to FIGS. 8 through 12, an embodiment of the present invention will be described in detail. It is noted that the piezoelectric resonator in the embodiment is adapted such that one or two piezoelectric resonating elements 4 may be accommodated. In FIG. 8, lead portions 73 and 75 are formed integrally with parallel hoops 71 and 72 in such a manner as to link the two hoops. There is further provided a lead portion 74 extending from the hoop 71 in parallel with the lead portion 75. This lead portion 74 is coupled with the lead portion 75 by way of a junction portion 79. A flat portion 731 extends substantially from a central portion of the lead portion 73 in a direction parallel with the hoops 71 and 72. There is disposed a contact portion 76 bridging between a tip of the flat portion 731 and a tip of the lead portion 74, which contact portion having a trapezoidal crosssection with a dwell portion at its top. The lead portion 73, the flat portion 731 and the contact portion 76 constitute a first terminal.

Another flat portion 722 extends from the opposite hoop 72. Between a tip of the flat portion 722 and the counterpart of a flat portion 791 extending from the junction portion 79 there is disposed a contact portion 77 having a width substantially twice that of the contact portion 76. The flat portions 722 and 791, combined with the contact portion 77 define a common or shared terminal. Furthermore, a flat portion 723 extends from the hoop 72 and a contact portion 78 having the same width as that of the contact portion 76 is disposed to bridge between a tip of the flat portion 723 and a tip of a flat extension 751 of the lead portion 75. The flat portions 723, the lead portion 75 and the contact portion 78 define a second terminal. The contact portion 76 is to contact an input electrode of one of the two piezoelectric elements, the contact portion 77 is to contact an output electrode of said one piezoelectric resonating element and an input electrode of the other piezoelectric resonating element and the contact portion 78 is to contact an output electrode of the other piezoelectric resonating element, for example. It is noted that the hoops 71 and 72 are provided with positioning holes 711 and 721.

As is seen from FIG. 9, base 8 is formed on the lead frame 7 of FIG. 8 as a casing for accommodation of the piezoelectric resonating elements 4, by molding insulating material such as synthetic resin, for example. The base 8 has a box shape with an open top surface and includes an open cavity 81 so as to expose the top surfaces of the contact portions 76 to 78. The cavity 81 is to accommodate the two piezoelectric resonating elements 4. Ledges 82, 83 and 84 are disposed to surround a central portion of the cavity 81. The provision of the those ledges 82 to 84 are for placement of the piezoelectric resonating elements 4 and a sheet 3 of anisotropic conductive rubber. In addition, the base 8 is provided at its both side walls with receiving portions 85 and 86 for installment of a common electrode plate 9 as a fourth terminal as described below.

Turning to FIG. 10, the common electrode plate 9 will now be discussed. There is illustrated a lead portion 92 which extends from a hoop 91 and has its tip portion 93 bent and coupled with a frame 94. The frame 94 consists of two sides 941 and 942 running along the longitudinal direction of the frame and two sides 943 and 944 crossing at both ends of the two sides 941 and 942 and coupling the two sides 941 and 942. Formed in one of the sides 943 are two strip-shaped contact arms 95 and 96 which extend from that side 943 in a direction parallel with the elongated sides 941 and 942. These contact arms 95 and 96 are downwardly oriented at the root portion of the side 943 in order to come into electrical contact with whole electrodes 44 of the two piezoelectric resonating elements 4. Furthermore, outer edges of the two elongated sides 941 and 942 are downwardly bent so as to provide reinforcing portions 945 and 946. When the contact arms 95 and 96 are forced into contact with the whole electrodes 44 of the piezoelectric resonating elements 4, the reinforcing portions 945 and 946 prevent the elongated sides 941 and 942 from being bent at the root portions of the contact arms 95 and 96 due to upward stress exerted on the frame 94 under these circumstances. It is obvious that the same effect is also expected when the reinforcing portions 945 and 946 are formed only at portions of the outer edges of the elongated sides 941 and 942 corresponding to the root portions of the contact arms 95 and 96. There are further provided pawl members 97 and 98 which extend downwardly from the outer edges of the sides 943 and 944. The pawl members 97 and 98 fit tightly into the receiving portions 85 and 86 of the above mentioned base 8 for fixture of the common electrode plate 9 on the base 8.

Referring to FIGS. 8 through 11, one way to assemble the piezoelectric resonator will be described. The anisotropic conductive rubber sheet 3 is mounted on the portion of the base 8 as surrounded by the ledges 82 to 84, while the two piezoelectric resonating elements 4 are mounted in juxtaposition over the rubber sheet 3 with the input and output electrodes 42 and 43 thereof downwardly oriented. The input and output electrodes 42 and 43 of the respective piezoelectric resonating elements 4 come into electrical contact with the contact portions 76 to 78 of the lead frame 7 independently of each other, through the anisotropic conductive rubber sheet 3. Subsequently, the common electrode plate 9 is mounted on the base 8. When this occurs, the pawl members 97 and 98 fit into the receiving portions 85 and 86 of the base 8. Provided that the common electrode plate 9 is fixedly secured on the base 8 by means of the pawl members 97 and 98, the contact arms 95 and 96 of the common electrode plate 9 never fail to come into electrical contact with the whole electrodes 44 of the respective piezoelectric resonating elements 4. The lead portion 74 and the junction portion 79 are cut along the phantom line A in FIG. 8 and the hoop 72 cut along the phantom line B.

Because the lead portion 74 and the junction portion 79 are cut in the above step, the respective contact portions 76, 77 and 78 are electrically independent of each other so that the two piezoelectric resonating elements 4 are serially, connected. A casing 10 (FIG. 12) having an opening 101 at its one side is prepared and placed to cover the resulting unit 100 from the opening 101. Resin is injected from the opening side 101 to combine as a single unit the unit 100 and the casing 10. Subsequently, the hoops 71 and 91 are cut away.

It is also obvious that the unit 100 may be molded with synthetic resin, for example, instead of using the casing 10. In this case attention should be directed to prevent the synthetic resin from creeping into the cavity 81 of the base 8.

As noted earlier, the contact portions 76, 77 and 78 are made independent as separate contacts by cutting the lead portion 74 of the lead frame 7 and the junction portion 79 connected to the lead portion 75. Accordingly, the contact portion 76 is forced into contact with the input electrode 42 of one of the piezoelectric resonating elements, the contact portion 77 forced into contact with the output electrode 43 of said one piezoelectric resonating element 4 and the input electrode 42 of the other piezoelectric resonating element 4, and the contact portion 78 forced into contact with the output electrode 43 of the other piezoelectric resonating element 4, thus providing a two-element terminal plate.

Figure 13:
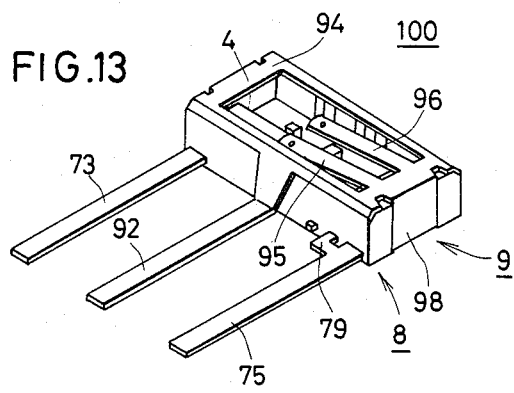
FIG. 13 is a perspective view of the appearance of the unit having a single piezoelectric resonating element received therein.

FIG. 13 is a perspective view of the appearance of a unit 100 in which only one piezoelectric resonating element is accommodated. In the example of FIG. 13, only one piezoelectric resonating element 4 is received within the base 8 whereby a single-element type resonator is provided. In other words, only one piezoelectric resonating element 4 is received on the side of the cavity 81 of the base 8 where the lead portions 73 and 75 are disposed. The junction portion 79 of the lead frame 7 in FIG. 8 is cut along the phantom line C. The result is that the lead portion 73 is electrically connected with the input electrode 41 of the piezoelectric resonating element 4 and the lead portion 75 is connected with the output electrode 42 thereof.

Figure 14:
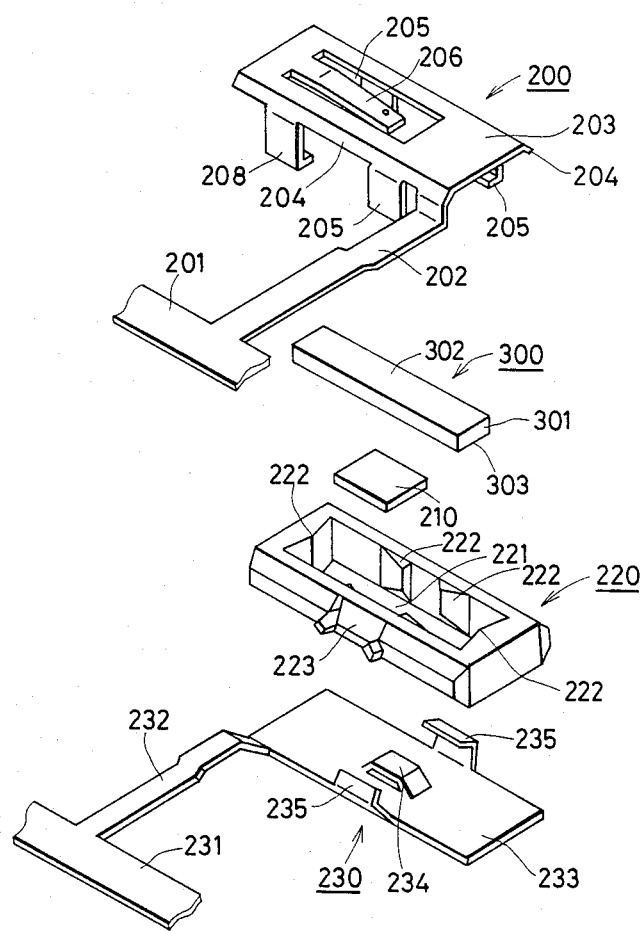
FIG. 14 is an external perspective view of the piezoelectric resonator wherein a single piezoelectric resonating element can be housed.

In FIG. 14, there is illustrated an exploded perspective view of a typical piezoelectric resonator having only one piezoelectric resonating element accommodated therein. While the typical device of FIG. 14 does not include the conception of the present invention that a plurality of the piezoelectric resonating elements are connected in multi-stage fashion, the piezoelectric resonator where only one piezoelectric resonating element is housed is also of importance for the purpose of the present invention.

In FIG. 14, an electrode plate 200 includes a lead portion 202 extending from a hoop 201 and has its tip portion coupled with a frame 203. In a manner similar to the common electrode plate 9 as shown in FIG. 10, the frame 203 is provided with reinforcing portions 204 at outer edges of its sides extending along the direction of its length. It is noted that only one contact arm 206 is provided because only one piezoelectric resonating element 300 is accommodated in the illustrated embodiment. Moreover, two pairs of pawl members 205 are formed at both sides, which extend downwardly from the reinforcing portions 204 running along the direction of the length of the frame 203.

The piezoelectric resonating element 300 is of a two-element type which has an electrode 302 on a major surface thereof and a counter electrode 303 on the opposite major surface thereof. A base 220 has a cavity 221 open at its top and bottom and a plurality of ledges 222 at an inner wall thereof for precise placement of the piezoelectric resonating element 300. Furthermore, receiving portions 223 are formed at outer side walls extending along the direction of the length of the base 220.

Another electrode plate 230 includes a lead portion 232 extending from a hoop 231 and having a flat portion 233 at its tip portion. The flat portion 233 has at top of its central portion a dwell portion where a contact portion 234 is defined to come into contact with the counter electrode 303 of the piezoelectric resonating element 300. The electrode plate 230 is further provided with pawl members 235 at its both side edges running along the length of the electrode plate 230. These pawl members 235 are to fit into the receiving portions 223 of the base 220.

One way to assemble this alternative embodiment will be discussed below. The pawl members 235 of the second electrode plate 230 are first placed to fit into the receiving portions 223 of the base 220. A sheet 210 of anisotropic conductive rubber is mounted on the contact portion 234 of the second electrode plate 230. In order for the counter electrode 303 to come into contact with the anisotropic conductive rubber sheet 210, the piezoelectric resonating element 300 is received within the cavity 221 of the base 220. The first electrode plate 200 is placed over the base so that the pawl members 205 of the electrode plate 200 fit into side walls of the base 220.

Figure 15:
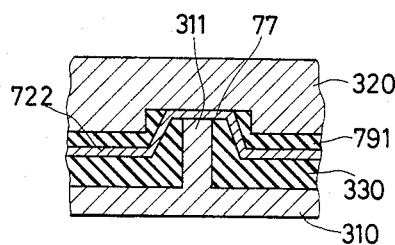
FIGS. 15 and 16 are views for explaining a method for making a conventional terminal-integrated casing, especially longitudinal cross-sectional views showing contact portions and its peripheries in an enlarging scale.
Figure 16:
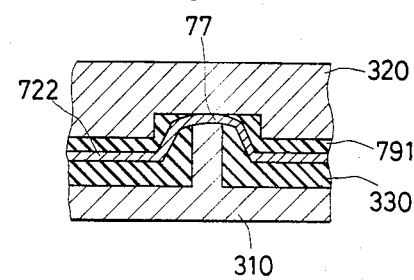

FIGS. 15 and 16 are views for explaining a method by which the lead frame 7 and the base 8 as shown in FIG. 9 are made integrally, especially longitudinal cross-sectional views showing in an enlarging scale the contact portion 77 and its periphery.

A typical method for making a an integrated terminal-casing which comprises the lead frame 7 and the base 8 in an integral form. When it is desired to mold integrally the lead frame 7 and the base 8, a female mold 310 and a male mold 320 are used. The lead frame 7 is mounted on the female mold 310. Under these circumstances, the contact portions 76, 77 and 78 of the lead frame 7 are supported by a standing stud 311 extending from the female mold 310. While the male mold 320 is disposed over the lead frame 7 with a desired spacing, insulating resin 330 is injected between the female mold 310 and the male mold 320. However, in the event that the manufacturing accuracy of the lead frame 7 is poor and the height of the contact portions 76, 77 and 78 of the trapezoidal profile is less than a predetermined height, the contact portions 76 to 78 are pressed by the top of the standing stud 311 of the female mold 310 and the bottom of the male mold 320 and the dwell portions of the contact portions 76 to 78 become curved as best shown in FIG. 16 under the conditions where the lead frame 7 is mounted on the female mold 310 and the male mold 320 is mounted from above. As a result, the insulating resin 330 is attached onto its periphery and so-called overcoating by the insulating resin takes place. For this reason, when the contact portions 76 to 78 are overlaid with the anisotropic conductive rubber sheet 3 and with the piezoelectric resonating element 4, there is the possibility of bad contact between the contact portions 76 to 78 and the input electrode 42 and the output electrode 43 of the piezoelectric resonating element 4. Pursuant to the teachings of the second invention, a terminal-integrated casing is fabricated in the following manner.

Figure 19:
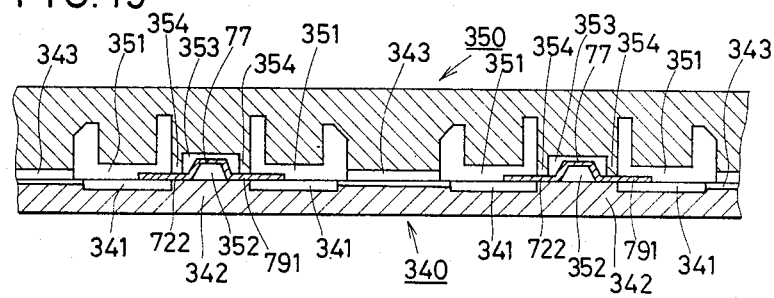
FIG. 19 is a longitudinal cross-sectional view, showing the lead frame lying sandwiched between the lower mold and an upper mold.
Figure 20:
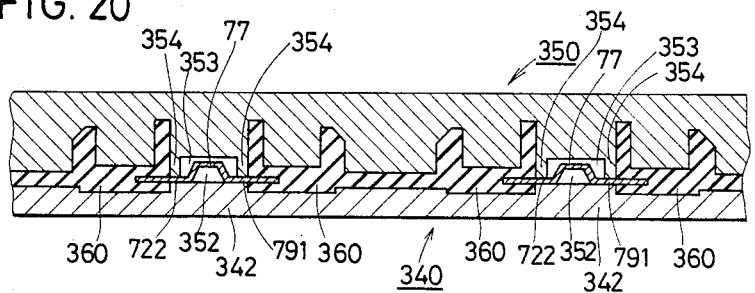
FIG. 20 is a longitudinal cross-sectional view, showing insulating resin injected between the lower and upper molds.
Figure 21A:
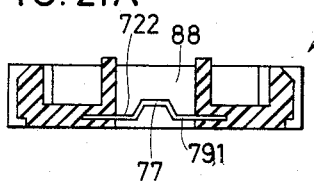
Figure 21B:
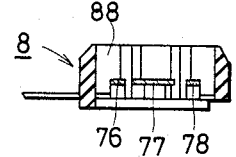

FIGS. 17A to 17C are external views of an improved integrated terminal-casing made according to the present invention, wherein FIG. 17A is a plan view, FIG. 17B is a bottom view and FIG. 17C is a side view. FIGS. 18 through 21B are views for explaining one way to manufacture such an improved terminal-integrated casing. More particularly, FIG. 18 is a plan view showing the lead frame 7 mounted on a female mold 340; FIG. 19 is a longitudinal cross sectional view showing the lead frame 7 lying sandwiched between the female mold 340 and a male mold 350; FIG. 20 is a longitudinal cross-sectional view showing insulating resin 360 injected between the female mold 340 and the male mold 350; and FIGS. 21A and 21B are views showing the terminal-integrated casing manufactured by the manner as shown in FIGS. 18 to 20, wherein FIG. 21A is a cross-sectional front view and FIG. 21B is a cross-sectional side view.

With reference to FIGS. 17A to 17C, the integrated terminal-casing to be manufactured according to the present invention will be described below. As in FIG. 21, the lead frame 7 is provided with the base 8 by molding. It is noted that a cavity 88 is defined at the peripheries of the contact portions 76, 77 and 78 of the lead frame 7 without molding of the insulating resin 6. A major feature of the second invention resides in a manufacturing method by which the base 8 is molded into the lead frame 7 in such a manner as to define the cavity 88 at the peripheries of the contact portions 76, 77 and 78.

As is seen from FIGS. 19 and 21B, the female mold 340 is prepared as a first mold and the male mold 350 as a second mold. The female mold 340 and the male mold 350 are formed with dimpled portions 341 and 351 which define the respective portions of the base 8 when injecting insulating resin 360 (FIG. 20) with the lead frame 7 sandwiched by the two molds. The female mold 340 is further provided with projected portions 342 which abut against the bottoms of flat portions 731, 741, 722, 723, 791 and 751 of the lead frame 7 connected to the contact portions 76, 77 and 78. With the lead frame 7 mounted on the female mold 340, there are defined first cavities 352 between the projected portions 342 of the female mold 340 and the trapezoidally-shaped contact portions 76, 77 and 78. The male mold 350, on the other hand, is provided with a pair of projected portions 354 whose tips abut against the flat portions 731, 741, 722, 723, 791 and 751 adjacent the contact portions 76, 77 and 78. Disposed between the two projected portions 354 is a recessed portion which falls short of the contact portions 76, 77 and 78 of the lead frame 7 when being sandwiched between the two molds. The recess portion defines a second cavity 353. To enable simultaneous manufacture of a plurality of the bases 8, the female mold 340 is provided with pluralities of the dimpled portions 341 and 351, the projected portions 342 and 354 and runner 343 communicating with the respective dimpled portions 341 and 351 are additionally provided.

The female mold 340 and the male mold 350 are prepared in the foregoing manner and lead frame 7 is mounted on the female mold 340 as indicated in FIG. 18 and thereafter overlaid with the male mold 350. At this time the bottoms of the flat portions at the peripheries of the contact portions 76 to 78 are placed for abutment against the tops of the projected portions 342 of the female mold 340, while the projected portions 354 of the male mold 350 are placed for abutment against the tops of the flat portions at the peripheries of the contact portions 76 to 78. As best shown in FIG. 20, the insulating resin 360 is injected through one end of the runner 343. Objectionable gases generated due to the injection of the insulating resin are discharged through the other end of the runner 343. The female mold 340 and the male mold 350 are detached after the insulating resin becomes solidified. Upon removal of burrs due to portions of the runner 343, the integrated terminal casing as illustrated in FIGS. 21A and 21B is completed.

Figure 22:
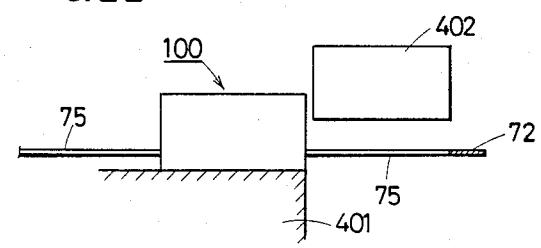
FIGS. 22 and 23 are views showing a method by which to cut unnecessary portions from a lead frame of a terminal-integrated casing.
Figure 23:
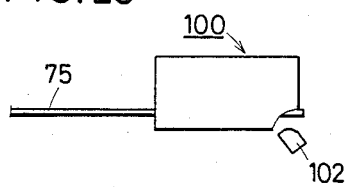

FIGS. 22 and 23 are views for explaining a method for cutting superfluous portions of the terminals extending from the lead frame 7 with the base 8 molded therein as in FIG. 9 to the hoop 72.

As stated previously, superfluous portions of the lead portions 73 and 75 extending from the hoop 72 and those of the flat portions 722 and 723 should be cut away before the unit 100 is incorporated into the casing 10. This cutting method involves mounting the unit 100 on a mold 401 and applying shearing force through a second mold 402 along its side wall, as seen from FIG. 22. Because both top and bottom portions of the lead portions 73 and 75 and the flat portions 722 and 723 are covered with the insulating resin, the bottom of the lead frame 7 is located over the top of the mold 401. Should shearing force be applied to the lead portions 73 and 75 and the flat portions 722 and 723 through the mold 402 from above, a corner portion 102 in a lower side of the base 8 may be chipped as depicted in FIG. 23. Even if the base 8 lacks a corner portion, it never detracts from the aesthetic appearance of the device because the base 8 is accommodated within the casing 10. Nevertheless, in the event that such cut portion is uneven and fragments remain attached on the base 8, there is the possibility that movement of the unit 100 may be interfered with when the unit 100 is inserted into the casing 10.

Thus, according to a third invention, unnecessary terminals can be cut in a manner described subsequently.

Figure 24:
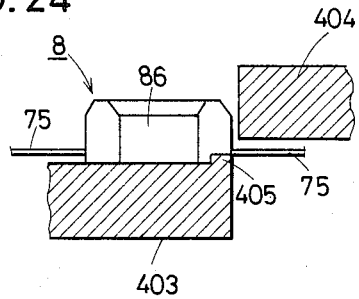
FIG. 24 is a view for explaining the method of terminal cutting according to the present invention.
Figure 25:
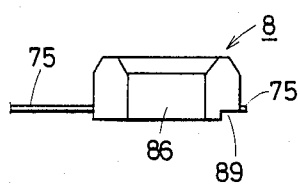
FIG. 25 is a side view showing the terminal-integrated casing with the unnecessary portions of the terminals removed.

FIG. 24 is a view for explaining one way to cut the terminals according to the present invention and FIG. 25 is a side view of a integrated terminal casing with terminals cut according to the present invention.

The integrated terminal casing, as shown in FIGS. 17A to 17C, comprises the lead frame 7 and the base 8 molded in the lead frame 7. The base 8 has a step portion 89. More particularly, the step portion 89 is such formed at a corner portion on the hoop side 72 of the bottom of the base 8 as to expose the bottoms of the lead portions 73, 75 and so forth of the lead frame 7.

To cut superfluous portions of the lead portions 73 and 75 of the lead frame 7 and those of the flat portions 722 and 723 extending from the contact portions 77 and 78 to the hoop 72, a female mold 403 and a male mold 404 are prepared. The female mold 403 is for disposition of the base 8 thereon and is provided with a projection 405 which corresponds to the step portion 89 of the base 8 when the same is mounted thereon. When the base 8 is disposed on the female mold 403, shearing force is applied to the lead portions 73 and 75 and the flat portions 772 and 723 along the side wall of the base 8 through the male mold 404 from above, cutting the superfluous portions of those portions. Under these circumstances, the top surface of the projection 405 of the female mold 403 is in contact with the lead portions 73 and 75 and the flat portions 722 and 723 exposed to the step portion 89 of the base 8. A corner portion of the base 8 is never chipped even under influence of upward stress on those lead portions 73 and so forth because no insulating resin is present beneath the step portion 89. Consequently, the appearance of the device will not be deteriorated even when the lead portion 73 and so forth are cut.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator, comprising:
(A) a first terminal plate including:
   (1) a first terminal having a contact portion and a lead portion electrically connected thereto;
   (2) a shared terminal having a contact portion and a lead portion electrically connected thereto; and
   (3) a second terminal having a contact portion and a lead portion electrically connected thereto, said shared terminal being electrically connected to said second terminal and being electrically insulated from said first terminal;
(B) a piezoelectric resonating element having an input electrode and an output electrode, said input electrode being in electrical contact with said contact portion of said first terminal, said output electrode being in electrical contact with said contact portion of said shared termianl; said piezoelectric resonating element further having a common electrode; and
(C) common electrode contact means including a contact portion and a lead portion electrically connected thereto, said contact portion of said common electrode contact means being in electrical contact with said common electrode.

2. The piezoelectric resonator of claim 1, wherein said contact portions are each formed by a respective strip of metal bent into a generally trapezoidal shape.

3. The piezoelectric resonator of claim 1, further including an insulative molded base having said first terminal plate formed integrally therewith, said resonating element being housed in said base.

4. The piezoelectric resonator of claim 3, wherein each of said lead portions extends through said base to a respective outside edge of said base and wherein said base includes a step portion which exposes the lower surfaces of said contact portions in an area adjacent the respective edge of said lead base through which said portion extends.

5. The piezoelectric resonator of claim 3, wherein said input and output electrodes of said piezoelectric resonating element are formed on a first surface of said piezoelectric resonating element and wherein said common electrode is formed on a second surface of said resonating element which opposes said first surface, said common electrode contact means comprising a second terminal plate having said contact portion and said lead portion of said common electrode contact means formed therein.

6. The piezoelectric resonator of claim 5, wherein said second terminal plate includes a pair of pawl members at least one of which fits into a respective receiving portion formed on the side surface of said base.

7. The piezoelectric resonator of claim 6, wherein said second terminal plate includes a pair of elongated sides whose opposite ends are connected by respective short sides, said contact portion extending from one of said short sides, said elongated sides including respective reinforcing portions formed by bending the outer edge of the respective elongated side, and said pawl members depending from respective ones of said short sides.

8. The piezoelectric resonator of claim 6, further including a housing in which said first and second terminal plates, said piezoelectric resonating element and said insulative molded base are housed.

9. A piezoelectric resonator, comprising:
(A) a first terminal plate including:
   (1) a first terminal having a contact portion and a lead portion electrically connected thereto:
   (2) a shared terminal having a contact portion and a lead portion electrically connected thereto; and
   (3) a second terminal having a contact portion and a lead portion electrically connected thereto; said first terminal, said shared terminal and said second terminal being electrically insulated from one another;
(B) first and second piezoelectric resonating elements each having an input electrode and an output electrode, said input electrode of said first piezoelectric resonating element being in electrical contact with said contact portion of said first terminal, said output electrode of said first piezoelectric resonating element being in electrical contact with said contact portion of said shared terminal, and said output electrode of said second piezoelectric resonating element being in electrical contact with said contact portion of said second terminal; each of said first and second piezoelectric resonating elements further having a common electrode; and
(C) common electrode contact means including a contact portion and a lead portion electrically connected thereto, said contact portion of said common electrode contact means being in electrical contact with said common electrodes of said first and second piezoelectric resonating elements.

10. The piezoelectric resonator of claim 9, wherein said contact portions are each formed by a respective strip of metal bent into a generally trapezoidal shape.

11. The piezoelectric resonator of claim 9, further including an insulative molded base having said first terminal plate formed integrally therewith, said resonating element being housed in said base.

12. The piezoelectric resonator of claim 11, wherein each of said load portions extends through said base to a respective outside edge of said base and wherein said base includes a step portion which exposes the lower surfaces of said contact portions in an area adjacent the respective edge of said lead base through which said portion extends.

13. The piezoelectric resonator of claim 11, wherein said input and output electrodes of said piezoelectric resonating element are formed on a first surface of said piezoelectric resonating element and wherein said common electrode is formed on a second surface of said resonating element which opposes said first surface, said common electrode contact means comprising a second terminal plate having said contact portion and said lead portion of said common electrode contact means formed therein.

14. The piezoelectric resonator of claim 13, wherein said second terminal plate includes a pair of pawl members at least one of which fits into a respective receiving portion formed on the side surface of said base.

15. The piezoelectric resonator of claim 14, wherein said second terminal plate includes a pair of elongated sides whose opposite ends are connected by respective short sides, said contact portion extending from one of said short sides, said elongated sides including respective reinforcing portions formed by bending the outer edge of the respective elongated side, and said pawl members depending from respective ones of said short sides.

16. The piezoelectric resonator of claim 14, further including a housing which houses said first and second terminal plates, said first and second piezoelectric resonating elements and said molded base.

* * * * *